(12) United States Patent
Weber et al.

(10) Patent No.: US 7,890,903 B2
(45) Date of Patent: Feb. 15, 2011

(54) METHOD AND SYSTEM FOR FORMAL VERIFICATION OF AN ELECTRONIC CIRCUIT DESIGN

(75) Inventors: Kai Weber, Baden-Württemberg (DE); Matthias Pflanz, Baden-Württemberg (DE); Christian Jacobi, Baden-Württemberg (DE); Udo Krautz, Stuttgart (DE)

(73) Assignee: International Business Machines Corporation, Armonk, NY (US)

( * ) Notice: Subject to any disclaimer, the term of this patent is extended or adjusted under 35 U.S.C. 154(b) by 434 days.

(21) Appl. No.: 12/129,127

(22) Filed: May 29, 2008

(65) Prior Publication Data

US 2009/0300560 A1  Dec. 3, 2009

(51) Int. Cl.
*G06F 17/50* (2006.01)
(52) U.S. Cl. ............................................. 716/5
(58) Field of Classification Search ............ 716/4–6
See application file for complete search history.

(56) References Cited

U.S. PATENT DOCUMENTS

| | | | | |
|---|---|---|---|---|
| 7,110,935 | B1 * | 9/2006 | Hwang et al. | 703/20 |
| 7,222,315 | B2 * | 5/2007 | Schubert et al. | 716/4 |
| 7,356,786 | B2 * | 4/2008 | Schubert et al. | 716/4 |

OTHER PUBLICATIONS

Y. Chang, K. Cheng; Induction-Based Gate-Level Verification of Multipliers, University of California, Santa Barbara, CA, 2001 IEEE.
M. D. Aagaard, C H. Seger; The Formal Verification of a Pipelined Double-Precision IEEE Floating-Point Multiplier; Dept. of Comp. Sci, University of British Columbia, Sep. 1995.
D. Stoffel, W. Kunz; Verification of Integer Multipliers on the Arithmetic Bit Level; Institute of Computer Science, University of Frankfurt; 2001 IEEE.
R.E. Bryant, Y. Chen; Verification of Arithmetic Circuits with Binary Moment Diagrams; Carnegie Mellon University, $32^{nd}$ Design Automation Conference, Jun. 1995.

* cited by examiner

*Primary Examiner*—Jack Chiang
*Assistant Examiner*—Binh C Tat
(74) *Attorney, Agent, or Firm*—Matthew W. Baca; Ortiz & Lopez, PLLC

(57) ABSTRACT

A new and convenient methodology for proving the correctness of multiplier and multiply-accumulate circuit designs in a full custom design flow. Such an approach utilizes a basic description of the implemented algorithm, which is created in early phases of the design flow and requires only little extra work for the designer who spends most of the time in full-custom optimizations. Such an approach also defines arithmetic circuit at the arithmetic bit level and allows for the generation of a gate level netlist. Given a structural similarity between the specification and design under verification, a large amount of structural similarity between the generated netlists is obtained so that a standard equivalence checker can be utilized to verify the design against the specification.

10 Claims, 4 Drawing Sheets

```
       ⎧  variables {
       ⎪     a: in (0 to 3);
       ⎪     b: in (0 to3);
       ⎪     sum: out (0 to 7);
       ⎪     carry: out (0 to 7)
       ⎪     prod: out (0 to 7)
       ⎪     ppb: pp(a,b) (0 to 2)
       ⎪  }
       ⎪
       ⎪  pp_def{
       ⎪     ppb(0)<=PG(a(0 to 3), Booth(0&0&b(0),2,2),0);
   50 ⎨     ppb(1)<=PG(a(0 to 3), Booth(b(0 to 2),2,2),1);
       ⎪     ppb(2)<=PG(a(0 to 3), Booth(b(2 to 3)&0,2,2),2);
       ⎪  }
       ⎪
       ⎪  tree_def{
       ⎪     sla<=SUM(ppb(0), ppb(1), ppb(2));
       ⎪     cla<=CARRY(ppb(0), ppb(1), ppb(2));
       ⎪     sum<=sla
       ⎪     carry<=cla
       ⎪     nt_prod<=SUM(sla,cla);
       ⎪     prod<=int_prod
       ⎩  }
```

FIG. 3

| OPERATION | CPU TIME | |
|---|---|---|
| | AP | EC |
| 4x4 | 0.6s | 2s |
| 8x8 | 1s | 2s |
| 8x8+8x8+8x8+8x8 | 1 min | 2s |
| 16x16+16x16 | 1 min | 10s |
| 24x24 | 1 min | 10s |
| 53x53 | 18 min | 15s |
| 64x64 | 33 min | 21s |

FIG. 4

METHOD AND SYSTEM FOR FORMAL VERIFICATION OF AN ELECTRONIC CIRCUIT DESIGN

TECHNICAL FIELD

The present invention relates to verification of designs of electronic circuits and more particularly to a methodology to formally verify highly optimized, industrial circuits performing arithmetic functions, particularly multipliers.

BACKGROUND OF THE INVENTION

Formal property checking has gained significant importance in System-on-Chip (SoC) verification and has become part of many industrial design flows. Unfortunately, arithmetic circuits with multiplication have always been and to some extent remain the show-stopper for formal property checking in industrial practice. Satisfiability is the problem of determining if the variables of a given Boolean formula can be assigned in such a way as to make the formula evaluate to TRUE.

Neither satisfiability (SAT) solving nor decision diagrams of any sort provide robust and universal frameworks to deal with arithmetic. Specialized "engineering" solutions are available that adapt to specific scenarios in equivalence checking or property checking. Most of these methods depend on exploiting specific high-level arithmetic information. This can be useful for highly regular designs as they may result from automatic module generation. However, for full-custom logic design, the problem has remained unsolved.

When designing arithmetic units for high-performance applications, a designer will usually start implementing a basic version of the algorithm. At this point, word-level abstractions are still available in the design. However, as aggressive timing requirements have to be met, the initial algorithm has to be modified and optimized by a series of manual steps involving transformations at all levels. Such a full-custom implementation is not only of high complexity, its specialized structure makes it difficult to apply any kind of abstraction above the Boolean bit-level.

Obviously, designs resulting from such a manual optimization process may contain errors which are hard to find and which will surface late in the design cycle and may not be found by simulation or emulation. Even after many years, and in spite of substantial progress in formal verification, functional correctness of full-custom arithmetic has remained a major concern in SoC design flows.

Multipliers have become very common in today's designs of processors, digital signal processors, hardware accelerators and other signal processing devices. While standard property checking usually fails for such designs, in industrial practice it is often attempted to verify these designs by equivalence checking against some reference. This can work well if reference and design have a large amount of structural similarities and share many functionally equivalent signals. But, if design and reference have different architectures, the equivalence check immediately becomes impossible.

In the context of verifying floating-point-units (FPUs) their embedded multipliers are separated from formal approaches, e.g. by so called black boxing and checking by simulation as described in the paper of C. Jacobi et al., "Automatic Verification of Fused Multiply-Add FPUs" published in Design, Automation and Test in Europe 2005, Proceedings, vol. 2, pp. 1298-1303.

Multipliers lack a compact canonical representation that can be built efficiently from gate level implementations. A BDD (BDD=a Binary Decision Diagram) is a data structure for representing Boolean functions. For ROBDDs (ROBDD=Reduced Ordered BDD), it is well-known that the number of nodes grows exponentially with the number of input bits to the multiplier. Even if binary decision diagrams (BDDs) are not directly used to build the multiplier outputs but only certain internal relations, they lack robustness and suffer from BDD node explosion. For instance, A. Kuehlmann et al., "Robust Boolean Reasoning for Equivalence Checking and Functional Property Verification", published in IEEE Transactions on Computer-Aided Design of Integrated Circuits and Systems, December 2005, vol. 21, pp. 1377-1394, discloses a combination of techniques for Boolean reasoning based on BDDs, structural transformations an SAT procedure and random simulation natively working on a shared graph representation of the problems of formal equivalence checking and property verification as well as other CAD applications (CAD=Computer Aided Design).

There have been several attempts to solve the multiplier verification problem with different variants of decision diagrams. Word level decision diagrams called BMDs (BMD=Binary Moment Diagram) can be used to efficiently represent integer multiplication. A *BMD (star-BMD) is a multiplicative BMD with the particular characteristic to grow linearly for multiplication. In a *BMD, the number of nodes to represent integer multiplication only grows linearly in contrast to the exponential growth of a BDD. Several improvements have been made, but the main obstacle remains—BMDs require word level information about the design which usually is not available or is very hard to extract from highly optimized gate level descriptions being typical in high performance applications. When building *BMDs for such highly irregular multipliers, the same node explosion can be observed during the construction process as for BDDs, in spite of the theoretical result that the final representation will be compact.

In the paper of D. Stoffel and W. Kunz "Verification of integer multipliers on the arithmetic bit level", published in ICCAD 2001, pp. 183-189, an equivalent network of bit adders is extracted from a gate level description of arithmetic circuits. Equivalence between two extracted networks is proven by a simple calculus. In the paper of M. Wedler et al., "Normalization at the arithmetic bit level", published in Proceedings of the 42nd Design Automation Conference, June 2005, pp. 457-462, this work is extended towards applications in property checking. A normalization process is provided that creates structural similarities between the design under verification and the specification given as a property. However, it is assumed that not only the property but also the design is specified at the arithmetic bit level or higher levels of abstraction. Both approaches rely on the successful extraction of the arithmetic bit level information. This is possible for synthesized netlists, but in full-custom design the situation is different. Manual architectural changes and full-custom optimizations may involve global transformations. Extraction of an arithmetic bit-level description can turn out to be quite difficult since there are an exponential number of possible decompositions.

BRIEF SUMMARY

The following summary is provided to facilitate an understanding of some of the innovative features unique to the embodiments disclosed and is not intended to be a full description. A full appreciation of the various aspects of the embodiments can be gained by taking the entire specification, claims, drawings, and abstract as a whole.

It is, therefore, one aspect of the present invention to provide a method for a formal verification of arithmetic circuits with multiplication which provides an automatic proof framework.

It is another aspect of the present invention to provide a system for performing the aforementioned method.

The aforementioned aspects and other objectives and advantages can now be achieved as described herein. A method and system are disclosed for the formal verification of an electronic circuit design, wherein the electronic circuit performs at least one arithmetic multiplication operation, and wherein a netlist of the circuit design is provided. The circuit design is generally based on a Booth encoding for the multiplication operations, the method comprising the steps of: providing a reference design on a word level which is based on an abstract language specification comprising an arithmetic and a structural description for a netlist of the reference design, wherein the specification comprises a partial product generator that determines a chosen Booth-encoding and computes the partial product with respect to this encoding, and wherein the specification further comprises an adder tree that sums all partial products, and wherein the adder networks of both the reference design and the circuit design have the same topology, and wherein the Booth encoding of the reference design is equal to the Boot encoding of the circuit design; adding correction signals for sign conversion of negative values to the reference design and the circuit design; converting the reference design into a reference gate netlist; performing an equivalence check between the reference gate netlist and the netlist of the circuit design; extracting an adder network from the reference design; checking the arithmetic functions that the adder network can perform; and deciding on the correctness of the circuit design based on the results of the equivalence check between the reference gate netlist and the netlist of the circuit design and the arithmetic function check of the extracted adder network.

A new and convenient methodology for proving the correctness of multiplier and multiply-accumulate circuit designs in a full custom design flow is therefore disclosed herein. Such an approach utilizes a basic description of the implemented algorithm, which is created in early phases of the design flow and requires only little extra work for the designer who spends most of the time in full-custom optimizations. The disclosed embodiments define the arithmetic circuit at the arithmetic bit level and allows for generation of a gate level netlist. Given a structural similarity between the specification and design under verification, a large amount of structural similarity between the generated netlists is obtained so that a standard equivalence checker can be utilized to verify the design against the specification. Furthermore, the correctness of the specification is proven by arithmetic bit-level reasoning.

A typical application of the preferred method can be found in the context of verifying floating-point-units (FPUs). In such a scenario, embedded multipliers are separated for formal approaches, e.g. by black boxing as disclosed by C. Jacobi et al., "Automatic Verification of Fused Multiply-Add FPUs" published in Design, Automation and Test in Europe 2005, Proceedings, vol. 2, pp. 1298-1303, and often checked by simulation. With the disclosed technique, the designer will provide a high level description of the implemented algorithm that allows early verification of the multiplier's data path.

A favorable multiplier description language is also disclosed, which abstracts from low-level optimizations and which can model a wide range of common implementations at a structural and arithmetic level.

The correctness of the created reference design is established by bit level transformations matching the model reference design against a standard multiplication specification. The reference design is also translated into a gate netlist to be compared with a full-custom implementation of a preferred multiplier by standard equivalence checking. The advantage of this approach is that a high level language can be used to provide the correlation between structure and bit level arithmetic. This compares favorably with other approaches that have to spend considerable effort on extracting this information from highly optimized implementations. The preferred method is easily portable and proved applicable to a wide variety of state-of-the-art industrial designs.

According to another aspect of the invention, a program product comprising a computer useable medium having a computer readable product, wherein the computer readable program when executed on a computer causes the computer to perform the preferred method, as well as a data processing program in a data processing system comprising software code portions for performing the method is disclosed.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

FIG. 3 illustrates an example for a specification of a 4-bit multiplier algorithm in a preferred ARDL language;

FIG. 4 illustrates an example of experiments runtime according to a preferred method.

DETAILED DESCRIPTION

The particular values and configurations discussed in these non-limiting examples can be varied and are cited merely to illustrate at least one embodiment and are not intended to limit the scope thereof.

Throughout this specification the term "multiplication" refers to integer multiplication. The following notations will be used:

a is a vector of n Boolean variables with $$a = (a_{n-1}, \ldots, a_0) = a[n-1:0].$$

The vector a represents a natural number $$\langle a \rangle = \sum_{i=0}^{n-1} a_i \cdot 2^i.$$

With vectors a and b given as a=a[n−1:0] and b=b[m−1:0], the product of both shall be defined as $\langle r \rangle = \langle a \rangle \cdot \langle b \rangle$, (i.e. the product of the natural numbers represented by the vectors a, b, and r=r[m+n−1:0]).

Figure 1:
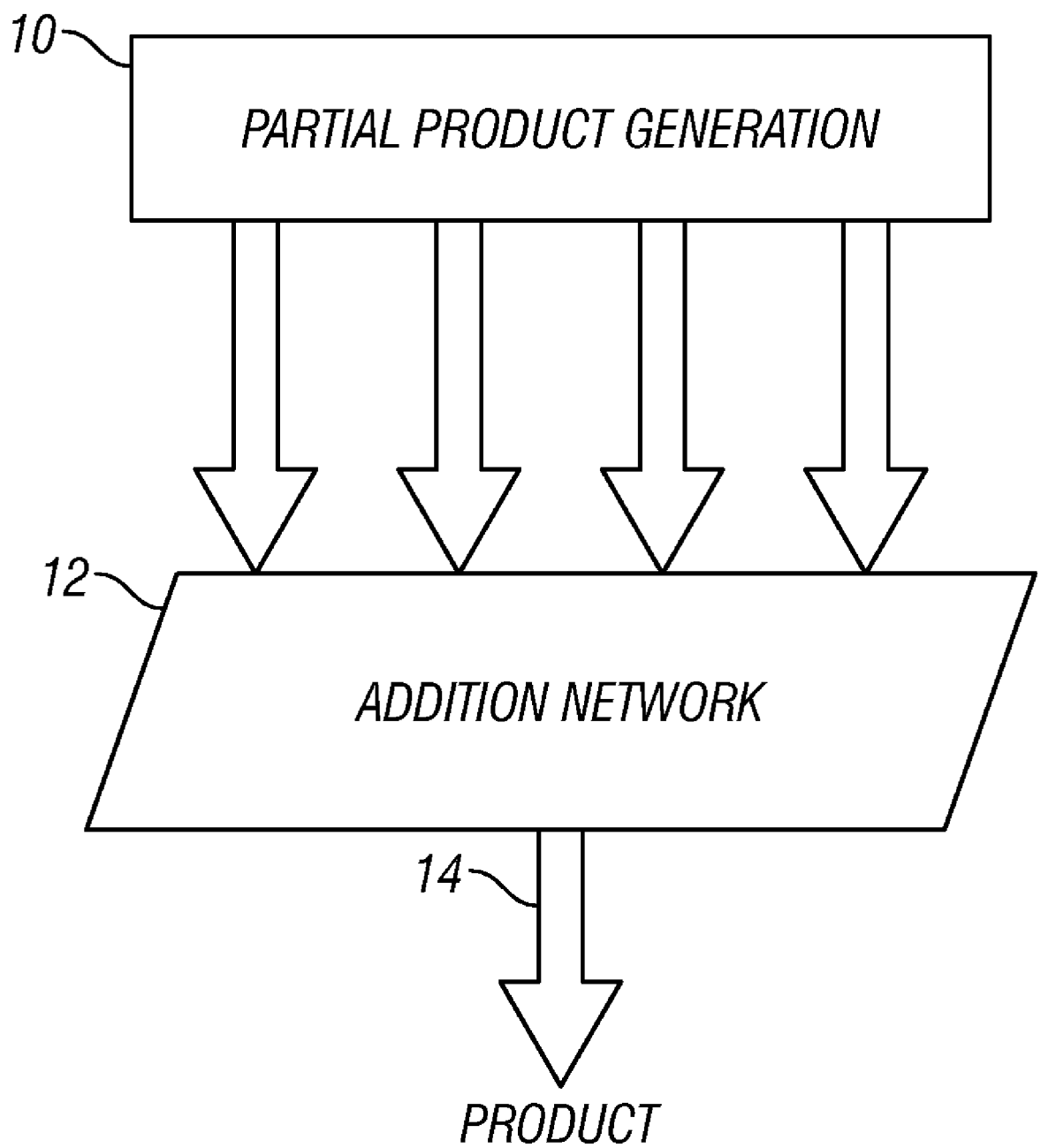
FIG. 1 illustrates a typical basic multiplier architecture.

Typically, a multiplier can be divided into two portions, as depicted in FIG. 1, a generator 10 of "partial products" and an addition network 12 (adder-tree) to generate a product 14 as the multiplication result.

Two definitions of partial products are used:

Definition 1: Partial product generation calculates a set of vectors $pp_j=pp_j[m+n-1:0]$ for vectors $a=a[n-1:0]$ and $b=b[m-1:0]$ (index j represents the number of partial products which depend on the Booth-encoding and the width of the operands). Usually they are defined by bitwise multiplication $pp_j=a \cdot b[j] \cdot 2^j$ or some Booth-encoding $pp_j=a \cdot B_j$. It holds $$\langle r \rangle = \sum_j \langle pp_j \rangle = \sum_{k=0}^{m+n-1} r_k \cdot 2^k.$$

Notice that partial products may contain p leading zeros and q trailing zeros $pp_j=(0^p, pp_{j,m+n-1}, \ldots, pp_{j,0}, 0^q)$.

The second portion is a network of adders, which is used to sum up the partial products to the final multiplication result.

Definition 2: Following the paper of M. Wedler et al., "Normalization at the arithmetic bit level", published in Proceedings of the 42nd Design Automation Conference, June 2005, pp. 457-462, an addition network is a set of Boolean variables $A_i$ being the addends to the network.

An addend $a \in A_i$ contributes to column i of the network. Addends are weighted by signed integers $\omega_i: A_i \to Z$ with Z being natural integers. The result of the addition network $r=r[m+n-1:0]$ may be defined as the sum of weighted addition network outputs:

$$\langle r \rangle = \sum_{i=0}^{m+n-1} 2^i \cdot \left( \sum_{a \in A_i} \omega_i(a_i) \cdot a_i \right)$$

Figure 2:
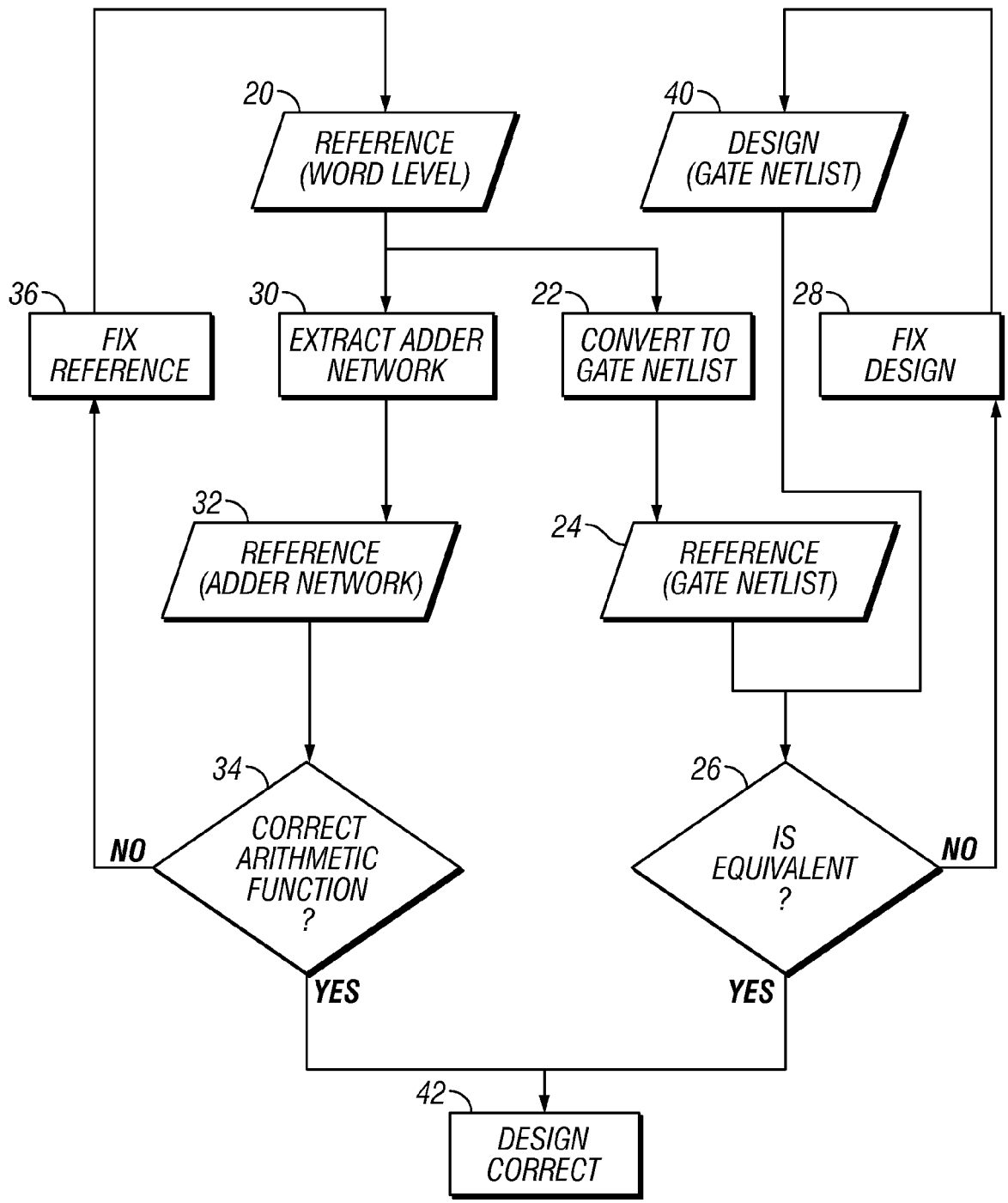
FIG. 2 illustrates a flow chart of a preferred methodology on multiplier verification according to the invention.

The basic flow for multiplier verification used in the preferred method according to the invention approach is depicted in FIG. 2. By way of example a designer designs a multiplier and wants to verify the multiplication function of the design. The design 40 of the multiplier is usually available as VDHL or a netlist, e.g. a gate netlist. A reference design 20 is provided on a word level (ARDL), preferably by a user, e.g. the designer.

The arithmetic reference description language (ARDL) preferably defines a set of arithmetic and auxiliary functions to describe arithmetic circuits. Such kinds of description have to be done by designers anyway when starting a design. ARDL allows for formalization of typical design considerations. Favorably, ARDL provides arithmetic information which can be used for a proof of the correct arithmetic function of the reference. Additionally ARDL provides structural information which can be used for an equivalence check between the reference design and the design to be verified.

The reference design is converted to a reference gate netlist in step 22. When the reference design is translated into the reference gate netlist, a VHDL is generated. The ARDL functions used for generating the reference design are replaced by VHDL templates, yielding data 24 of a reference gate list.

An equivalence check between the reference gate netlist and the netlist of the design to be verified is performed in step 26. If equivalence between the reference gate netlist and the netlist of the design to be verified is proven, then it is guaranteed that both perform the same function. A successful equivalence check is also an implicit proof that the reference design and the design to be verified describe the same function.

If the equivalence check in step 26 is not successful, then design can be corrected in optional step 28 (fix design).

If the equivalence check is successful, then the functional information given by the ARDL can be used. As the ARDL not only yields structural but also arithmetic information, additionally to the equivalence check in step 26 the reference design is translated into an addition scheme (i.e. an adder network is extracted from the reference design in step 30). For doing this, the ARDL functions used for generating the reference design are transformed into bit-level additions. This yields a reference adder network as data 32. In step 34, it is checked if the reference adder network performs the correct arithmetic function. This can easily be done by simple transformations to the addition scheme of textbook multiplication. If this is successful, then a correct arithmetic function is described by the reference adder network.

The user analyzes the results of the arithmetic function check performed in step 34. If the adder network has been proven as multiplication, then this is an implicit proof that the netlist of the design to be verified describes a multiplier.

If the proof is not successful, then in optional step 36 the reference design has to be corrected ("fix reference").

If the equivalence check as well as the arithmetic function proof has been successful, then the design is judged as correct in step 42.

The preferred language (ARDL) for providing the reference design 20 on a word level is used to formulate a detailed specification of the algorithm implemented by the design under verification. This description is similar to initial implementations that a designer will create when starting to implement, e.g. a given multiplier algorithm.

ARDL expresses the arithmetic definition of partial products (FIG. 1). A parametrizable function is provided for this purpose. This parametrizable function generates a partial product from a first operand x (comprising a certain number of bits) and a single bit of a second operand y. The partial product is expressed internally as a number of one-bit-multiplications. By way of example, an exemplified partial product $pp=(a0,a1,a2,a3)*b0$ with the first operand $x=(a0,a1,a2,a3)$ and a single bit b0 of the second operand y is represented as $(a0*b0,a1*b0,a2*b0,a3*b0)$. This bitwise treatment allows for a proof of arithmetic function and represents the real behavior of the hardware (e.g. multiplier) on an arithmetic bit level.

In hardware, usually a method is used which allows for reducing the number of partial products. This so called Booth encoding uses several bits of the second operand y for generating a Booth digit. The generated Booth digit is then multiplied by the first operand x. Although this is a more complicated multiplication than without Booth encoding, it can be easily implemented in hardware, e.g. by shifting. Various Booth encodings are known in the art. Favorably, the parametrizable function in ARDL can represent any kind of Booth encoding. As a result, an internal representation of the partial products is generated consisting of one-bit-multiplications. Each of such one-bit multiplication, or each sum of one-bit multiplications when Booth encoding is used, forms one bit of a partial product and is exactly one input value for the adder network.

Elements of the adder network or adder tree (step 30) in ARDL are sum and carry functions with any number of parameters. The parameters describe the partial products which have to be summarized or intermediate results. For example, an exemplified multiplier has five partial products pp1, pp2, pp3, pp4, pp5. The product x*y of the two operands x, y is then $x*y=pp1+pp2+pp3+pp4+pp5$. The adder tree defines a dedicated order of the additions which can be expressed by terms in parentheses $x*y=(pp1+pp2)+((pp3+pp4)+pp5)$. In the reference design as well as in the design to be verified, this would be defined by intermediate adder stages s, e.g. pp1+pp2=s1; pp3+pp4=s2; s2+pp5=s3. The last stage of such an adder tree could then be defined as x*y=s1+s3. The complete addition up to the partial products can easily be restored by replacing the intermediate stages by their definition. This expansion of the defined product (e.g. product 14, FIG. 1) in ARDL can be performed by the adder network (adder tree). By this, a bit-accurate mapping of the multiplier algorithm can be generated by expressing the multiplier algorithm by addition and one-bit multiplications. It is not possible to effectively derive such a representation from industrial multipliers on gate level known in the art.

The language ARDL used to define the reference design will be outlined in detail in the section "Reference Description Language" below.

In contrast to reference designs specified in standard property languages known in the art, ARDL favorably provides a mechanism to translate the reference design into a reference gate netlist (step 22). This mechanism maintains the structure described in the reference design. If, therefore, the reference design is structurally similar to the design under verification, then the reference gate netlist shows significant structural similarity with the gate netlist of the design under verification. Hence, a standard equivalence checker can be used to prove equivalence between reference and implementation (step 26). Furthermore, besides providing arithmetic functions that can be used to specify partial products, as already mentioned, the preferred specification language provides a way to describe the addition network of the preferred implementation.

Consequently, it is very easy to extract the adder network out of the reference design (step 30). It can be proven that the reference design is a correct model for multiplication with a series of simple transformations of the network that leads to a standard representation for multiplication. The transformations are described in the section "Proving Arithmetic Correctness" in more detail. The transformation process, favorably, can be fully automated.

Thus, correctness of the design can be concluded from arithmetic correctness of the reference design in conjunction with gate level equivalence between reference design and the design to be verified.

In some favorable implementations multipliers can be reused to implement more than one function. For example, several integer multiply-add operations can be calculated in parallel given a multiplier of sufficient bit width. The underlying ARDL arithmetic algorithms for such functions are slightly different from a standard multiplication algorithm. According to a favorable further development of the invention, this is approached by creating an individual specification and performing a separate verification run for each function.

Proving Arithmetic Correctness

In the following, details of step 30 are given for the transformations used to prove correctness of a multiplication algorithm and are described by utilizing associative and commutative laws for bit level addition. In contrast to M. Wedler et al., cited above, the distributive laws used in their approach are not needed.

Using these laws implementations with various optimizations can be verified, (e.g. Booth-encoding), through a series of transformations, restoring the basic definition of multiplication at the bit level:

$$\langle a \rangle \cdot \langle b \rangle = \left( \sum_i a_i \cdot 2^i \right) \cdot \left( \sum_j b_j \cdot 2^j \right) = \sum_k 2^k \sum_{k=i+j} a_i \cdot b_j$$

This equation defines an addition network where the products ($a_i \cdot b_j$) are addends to column k=i+j with weight $\omega(a_i b_j)=1$:

$$\langle r \rangle = \sum_k 2^k \cdot \sum_{k=i+j} a_i \cdot b_j \cdot \omega_{i,j}(a_i b_j).$$

This corresponds to multiplication learned in grade-school which is often expressed in matrix notation as follows:

$$P = \begin{matrix} & & \ldots & \ldots & a_2 b_0 & a_1 b_0 & a_0 b_0 \\ & & \ldots & a_2 b_1 & a_1 b_1 & a_0 b_1 & 0 \\ & a_2 b_2 & a_1 b_2 & a_0 b_2 & 0 & 0 \end{matrix}$$

In the following, it is shown how to transform other multiplication schemes used for implementation into this preferred basic reference scheme.

Many implementation techniques for multipliers focus on reducing the number of partial products. This will reduce the number of additions necessary to calculate the final result and will therefore reduce delay and area of the implementation. A prominent technique for this purpose is called Booth encoding.

Basic multiplication defines partial products by $pp_j=a \cdot b[j] \cdot 2^j$. These correspond to the lines given in matrix-notation of P. Booth encoding define a Booth-digit $B_j$ that subsumes several consecutive bits of b. The precise definition of the Booth-digit $B_j$ depends on the chosen radix. The prevalent version used in industry is the so called radix-4/Booth-2 encoding, where the Booth-digit $B_j$ is defined as $B_{2j}=-2b[j+1]+b[j]+b[j-1]$. In this version of Booth-2 encoding, the partial products are defined as $pp_j=a \cdot B_{2j}$. Obviously, $pp_j$ subsumes several partial products of the basic multiplier definition. In order to facilitate a transformation of the addition scheme generated by the algorithm with Booth-encoding into the basic multiplication scheme, independent partial products have to be considered rather than their aggregation. Hence, the partial products of the preferred reference are implemented by the expanded definition $pp_j=pp_{1,j}+pp_{2,j}+pp_{3,j}$, wherein the appropriate three partial products $pp_{1,j}=-2b[j+1] \cdot a \cdot 4^j$, $pp_{2,j}=b[j] \cdot a \cdot 4^j$ and $pp_{3,j}=b[j-1] \cdot a \cdot 4^j$ are added.

Booth encoding, therefore, results in negative weights $\omega_{i,j}(a_i b_{j+1}) < 0$ for $pp_{1,j}$. At the bit level, these negative numbers will be represented in two's complement. This would result in negated addends in the addition network. However, these negated addends will be canceled out throughout the addition network. In implementations, all negative addends are created by inversion and addition of an additional one to an appropriate column. Inversion of a single bit $a_i$ can be represented by $1-a_i=\overline{a_i}$.

When an inverted vector $\overline{a}$ is added to the addition network, every addend $\overline{a_i}$ to column i is replaced by two addends $-a_i$ and an additional addend $c_i=1$. These constants will cancel out with the hot-one bit specified in the reference model.

After this transformation the resulting addition network still shares significant discrepancy with respect to the basic multiplier definition. The observed differences can be summarized as follows: negative weights in columns due to subtraction; shifted addends; and addends are added into multiple columns However, if the underlying multiplication algorithm is sound all these differences will cancel out each other. For instance, addends that seem to be added twice into the network will be subtracted again later.

To transform arbitrary multiplications into the basic form, the following transformations are used:

Normalization: Let M be an addition network with addends $a_i b_j$. In the normalized addition network N(M) all occurrences of an addend $a_i b_j$ are moved to column k=i+j and the weight of $\omega_k = (a_i b_j)$ is modified accordingly.

Purging: In each column k of an addition network, M multiple instances $pp_{i-1} \ldots pp_0$ of an add end $a_i b_j$ are summarized by addition of the weights $$\omega_k(a_i b_j) = \sum_{s=0}^{l-1} \omega_k(pp_s).$$

The parameter I corresponds to the number of rows in the matrix in which the bitwise multiplication is expressed. Both operations lead to an equivalent addition network where the order of addition has been rearranged at bit level arithmetic and optimizations of the implementation have been reversed. It is possible to transform any equivalent addition network M to the basic multiplication scheme by M'=P(N(M)). In the resulting addition network M', one needs only to check whether $\omega_{i+j}(a_i b_j)=1$ and $\omega_k(a_i b_j)=0$ is valid for all i,j and k≠i+j. In this case, the correctness of the initial addition network and, hence, of the underlying algorithm has been proven.

Reference Description Language

In this section, a preferred arithmetic reference description language (ARDL) used to model the structure for implementations of multiplier-like functions is described. ARDL is used to create specifications on an abstraction layer between the gate level description of the design and the word level description of the corresponding arithmetic function. ARDL is restricted to combinatorial models, particularly models for logic without memory modules (e.g. latches, flipflops, etc). Sequential implementations can be handled by unfolding into a combinational netlist.

According to the flow of FIG. 2, the model described in the proposed language is used to generate a gate level as well as an arithmetic bit level description of the reference. In this way, the preferred language facilitates arithmetic reasoning at the bit level, in combination with a structural view of the implementation.

The syntax of the preferred language ARDL is close to the usual integrated circuit description languages like VHDL (VHDL=Very High Speed Integrated Circuit Description Language) or Verilog, a hardware description language known in the art, and relieves the user from learning very general and, therefore, much more complex specification languages like in PVS (PVS=Prototype Verification System). It only contains a few functions to describe basic elements of a multiplier.

Developing a reference model is quite natural in a typical design process. Often a very similar, but informal specification is created by designers anyway when starting to develop a new multiplier. The preferred language ARDL could substitute such an informal description.

In the first section of every ARDL reference description, the variables used for inputs, outputs and intermediate results are declared. This section, named variables, can be easily translated into the corresponding VHDL declarations. Preferably the following notations are used:

$a=(a_i, \ldots, a_0)$ always denotes a vector of Boolean variables called bit vector I,O are sets of bit vectors.

Every a∈I is called an input and every a∈O is called an output. ARDL requires that I∩O={Ø}.

The key words "in" and "out" indicate whether a declared variable is an input or an output. Further, variables are declared used as partial products with the keyword pp. Remaining intermediate variables of the adder tree are automatically determined.

The following two sections of an ARDL specification are named def_pp and def_tree, respectively. These sections are used to specify the arithmetic function calculated by the reference model. They correspond to the basic blocks depicted in FIG. 1. These blocks are: a partial product generator (partial product generation 10 in FIG. 1) that determines the chosen Booth-encoding and computes the partial product with respect to this encoding; and an adder-tree (addition network 12 in FIG. 1) that will sum all partial products.

In the def_pp section, the encoding for partial products can be chosen. Furthermore, there is an option to specify a segmentation of the inputs. For this purpose, the language provides functions for Booth encoding and partial product generation with the following signature: Booth(b,r,h) and PG(a, B,j)

Given an input vector b, the radix r∈N and the position $0 \leq h \leq m+n-1$ for the hot-one bit, function Booth(b,r,h) will calculate a bit vector B called Booth-digit for the selected encoding. As parameter for function Booth(b,r,h), b can be replaced by an arbitrary number of consecutive bits of b concatenated with constant values. Based on the resulting Booth digits B, the function PG will calculate the partial products $pp_j$ that are inputs to the addition part of the multiplier. Just like b, a can also be replaced by slices a' concatenated with constants in function calls to PG.

In order to model typical optimizations in adder trees for booth encoded partial products, a parameter h is used in function Booth(b,r,h) to indicate the position of the so called hot-one or hot-two bit. When generating the gate level reference, each call to the functions Booth(b,r,h) and $PG_j$ causes an instantiation of a corresponding generic VHDL entity. The arithmetic bit level description of the reference is generated by expanding the booth encoded partial products into weighted sums of bit wise multiplications $pp_j = pp_{1,j} + pp_{2,j} + pp_{3,j}$ as described above.

A special treatment for the negative addends has been implemented to handle the optimizations performed on the addition tree due to sign extensions.

It is now described how to specify the addition tree of a multiplier-like function implementation in ARDL. Given timing and area constrains, a designer will choose known standard Addstep-, CSA-, Wallace trees etc. (CSA=Carry Save Adder) to obtain an optimal implementation. For specifying such addition trees, ARDL provides functions with the following signatures:

SUM(A) and CARRY(A).

These functions map a set of vectors A to a single vector a. Since they are defined on sets of vectors, they can realize different tree structures with an arbitrary number of inputs to the nodes. The functions SUM(A) and CARRY(A) are translated into their gate level representations in a straightforward way by instantiation of a CSA-Adder with corresponding outputs for sum and carry.

In order to obtain the arithmetic bit level representation for the adder-tree, the intermediate results are recursively substituted by the arithmetic bit level description of their inputs. This process finally leads to a set of addition networks corresponding to the adders in the def_tree section. Note that the sets of addends for these addition networks will only contain partial products or primary inputs.

For the reference design, the equivalence of its gate level netlist and its arithmetic bit level description follows from the equivalence of the local function implementations.

The algorithm 50 shown in FIG. 3 gives an example of how a simple 4 bit multiplier with radix 2 booth encoding is specified in the proposed language AROL. This example defines an output for the final product and two additional outputs for the carry-save representation of the product.

Equivalence Check

When checking the equivalence of the ARDL reference and the design under verification, the reference model is compiled into VHDL as described in the previous section and standard equivalence checking is employed. To keep the equivalence check tractable, the following issues need to be given special consideration.

Equivalence checking is simple if a large number of internal equivalences between the designs under comparison exist. To benefit from this, the preferred description language is designed to describe the structure of the design under verification on an abstract level. The transformation of any reference in ARDL into a gate netlist maintains this structure. The circuit designer is requested to document the arithmetic algorithm and the implementing structure in the design using ARDL. This will lead to sufficient similarity between the reference multiplier and the design. In particular, the designer is requested to use the same topology of the adder tree for both, reference and implementation. This includes the order of inputs to the individual adders. This is essential as it is well known that swapping operands in addition trees is sufficient to eliminate most of the internal equivalences, thus increasing the proof complexity beyond the capacity of modern equivalence checkers.

Furthermore, it is favorable to create as much equivalence as possible related to inputs of the adder tree. This is achieved by creating the same partial products which requires that the same kind of Booth encoding is used for reference model and design. Even more equivalences on the inputs of the adder trees are achieved if the correction signals of negative values are added into the reference scheme in the same way as in the implementation. ARDL provides a mechanism to facilitate this.

Following the above guidelines, a high degree of structural similarity between reference and implementation can be obtained. It can be shown in experiments that nearly all intermediate results are equivalent between reference and design. Therefore, a structural analysis of both designs is usually sufficient to reduce the SAT instance by constant propagation and, even more importantly, by identical sub expression elimination, as described by A. Kuehlmann et al., "Robust Boolean Reasoning for Equivalence Checking and Functional Property Verification", published in IEEE Transactions on Computer-Aided Design of Integrated Circuits and Systems, December 2005, vol. 21, pp. 1377-1394. The proof will either show that design and reference are equivalent or a counter example will be calculated.

However, if an equivalence check is running for a very long time, as it can happen during development of the reference model, it is advisable to prove equivalences on internal signals. Again, since both multipliers are structurally very similar, it is easy to identify equivalent signals. Internal signals in the reference without a corresponding equivalent signal in the implementation often indicate that the topology of the adder tree chosen in the reference description does not match the implementation. In this case, it is advisable to modify the topology of the reference accordingly.

According to another preferred embodiment of the invention, it is shown how the proposed approach can be integrated into existing verification methodologies and how the approach can be extended to solve a wider range of verification problems.

Arithmetic units of modern processor designs often support instructions for more complex tasks than multiplication of two single operands. For example, some designs contain hardware to accelerate matrix operations in order to enhance image processing. Some of these operations consist of several multiplications and additions, but typically only one multiplier is realized in hardware. Nonetheless, if the multiplier is of sufficient width, it can be reused to calculate several smaller products in parallel. To calculate the sum of those products, additional shifters and adders are required in the design.

The preferred approach can also handle these complex operations. A distinct reference design model for every embedded operation of this kind is used. For the reference, the addition network of the multiplier reference design created when verifying the multiplier in the design is reused. This addition network is augmented with additional adders in the same way as it has been done in the design. By slicing portions of the operands, the appropriate encoding for the partial products is obtained.

A further extension of the preferred method according to the invention can be obtained by integrating the reference multiplier in more complex reference models for designs that use integer multipliers. For example, floating-point multiplication is performed on integer multipliers with additional logic for exponent handling and rounding. Approaches as given by C. Jacobi et al., "Automatic Verification of Fused Multiply-Add FPUs", published in Design, Automation and Test in Europe 2005, Proceedings, vol. 2, pp. 1298-1303, that black-box the multiplier, can benefit from the structurally similar preferred multiplier reference design that allows to do equivalence checking of a complete FPU reference design against the design under verification. Thereby, as a side effect, the verification of the integer multiplier completes the FPU verification efforts in a full custom design flow.

For evaluation, the proposed approach has been applied to verify several multiplier designs known in the art, created in a full custom design flow.

In order to show the flexibility of the preferred verification method according to the invention, an integer multiplier with Booth-2 encoding for 24 bit operands is verified. Example results are shown in table 100 in FIG. 4.

This exemplary reference design also supports addition of two 32-bit products or four 16-bit products. For each of the operations, a separate reference model has been created. The design implemented a mixture of encodings for negative values and required different tree structures for each operation. Integer multipliers for 53 bit and 64 bit operands are also tested. Furthermore, results of two experimental designs for 4 bit and 8 bit operands are also presented. By way of example, all results were computed on a 64 bit 2 GHz Power5® machine. By way of example, the depicted prototype implementation for the arithmetic check is based on a very simple scripting language. Therefore, it is to be expected that further optimizations of the implementation can reduce the CPU-time significantly.

Column one of the table shows the operation, columns two and three of the table show CPU-times for the arithmetic proof (AP; steps 30 to 34, FIG. 2) and for the equivalence check (EC; steps 22 to 26, FIG. 2). The results reflect the quadratic growth of the model's addition network with a CPU processing time for the arithmetic proof of 0.6 s for a 4 bit×4 bit multiplication increasing up to 33 min for a 64 bit×64 bit multiplication.

The time necessary to prove equivalence between reference and design is also related to the width of the multiplier. In these experiments, sub expression elimination was sufficient to solve the equivalence checking problems. Therefore, runtime increases with the number of expressions to be compared, e.g. from 2 s for a 4 bit×4 bit multiplication increasing up to 21 s for a 64 bit×64 bit multiplication.

Multiplier designs that can be described in the proposed language are presumably contained in nearly every design of arithmetic circuits for (e.g. IEEE754) floating-point and fixed-point operations. The manual effort to provide a preferred ARDL reference design is almost negligible compared to the overall design effort in a full-custom flow. While the data path for multiplication has to be tested by simulation in other approaches, the invention provides a formal proof of correctness. Hence, a high quality of the data path already in early design phases can be ensured favorably. This allows for a faster stabilization of the design throughout the design process and possible changes, like timing corrections, can be verified immediately. The proposed methodology complements tests by simulation to focus on control structures of arithmetic circuits.

A new approach for practical multiplier verification is disclosed based on a simple arithmetic proof in conjunction with equivalence checking. The key concept of the preferred method is the construction of a reference design model for the arithmetic circuit based on ARDL. The reference description serves two purposes. The underlying arithmetic can very easily be extracted at the bit level and prove it by transforming it to a radix-2 representation. Furthermore, a structurally similar VHDL representation of the reference can be constructed that implements the arithmetic described by the reference. By checking equivalence between the reference design and the design under verification, it can be decided whether the design under verification is correct or not. The approach has proven to be easily extendable to meet different multiplier designs.

The invention can take the form of an entirely hardware embodiment, an entirely software embodiment or an embodiment containing both hardware and software elements. In a preferred embodiment, the invention is implemented in software, which includes, but is not limited to, firmware, resident software, microcode, etc.

Furthermore, the invention can take the form of a computer program product accessible from a computer-usable or computer readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read-only memory (CD-ROM), compact disk-read/write (CD-R/W) and DVD.

Figure 5:
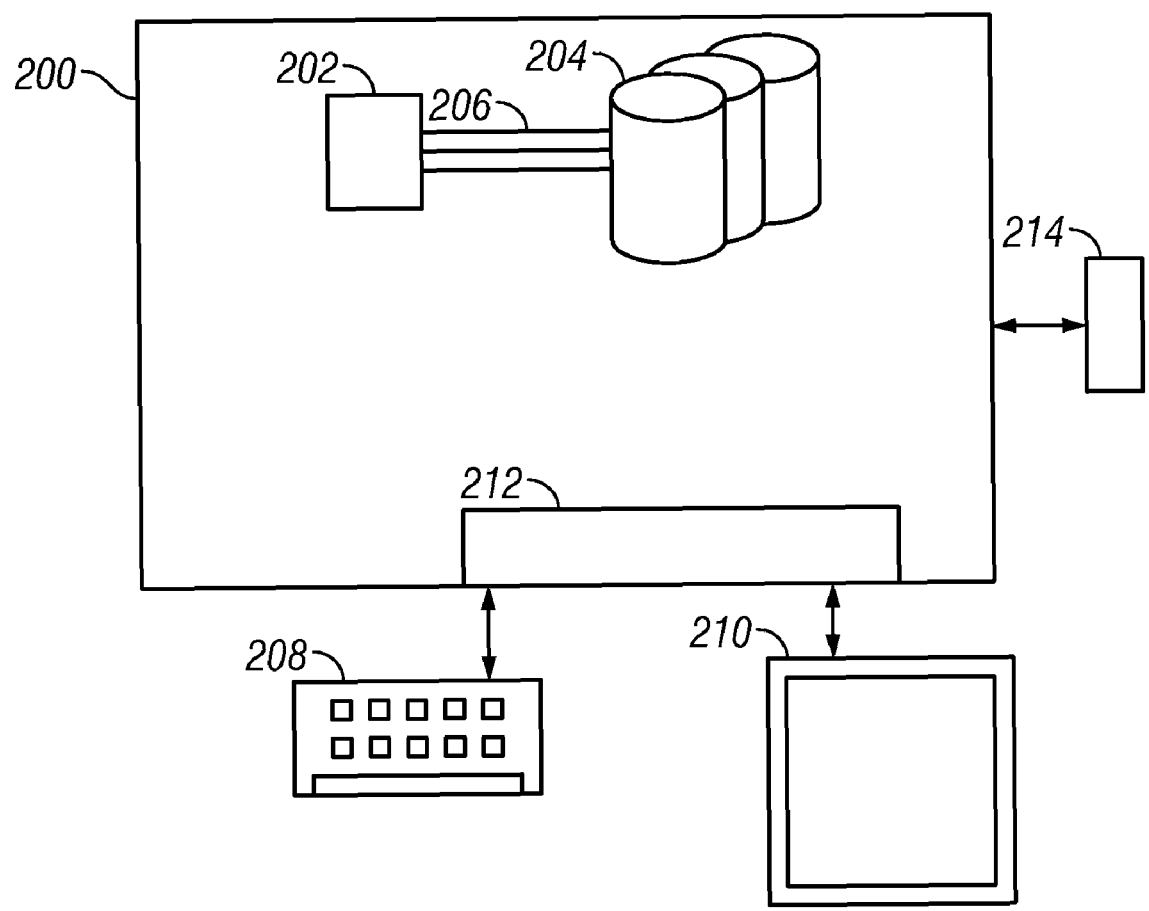
FIG. 5 illustrates a preferred data processing system for performing a method according to the invention.

A preferred data processing system 200 as schematically depicted in FIG. 5, suitable for storing and/or executing program code, will include at least one processor 202 coupled directly or indirectly to memory elements 204 through a system bus 206. The memory elements 204 can include local memory employed during actual execution of the program code, bulk storage, and cache memories which provide temporary storage of at least some program code in order to reduce the number of times code must be retrieved from bulk storage during execution.

Input/output or I/O-devices 208, 210 (including, but not limited to keyboards, displays, pointing devices, etc.) can be coupled to the system 200 either directly or through intervening I/O controllers 212.

Network adapters 214 may also be coupled to the system 200 to enable the data processing system or remote printers or storage devices through intervening private or public networks. Modems, cable modem and Ethernet cards are just a few of the currently available types of network adapters.

It will be appreciated that variations of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A method for formal verification of an electronic circuit design, said electronic circuit performing at least one arithmetic multiplication operation, wherein a netlist of said circuit design is provided, and wherein said circuit design is based on a Booth encoding for the multiplication operations, the method comprising the steps of:

providing a reference design on a word level which is based on an abstract language specification comprising an arithmetic and a structural description for a netlist of said reference design, wherein said specification further comprises a partial product generator that determines a chosen Booth-encoding and computes the partial product with respect to this encoding, and wherein said specification comprises an adder tree that sums all partial products, and wherein the adder networks of both the reference design and the circuit design have the same topology, and wherein the Booth encoding of said reference design is equal to the Booth encoding of said circuit design;

adding correction signals for sign conversion of negative values to said reference design and said circuit design;

converting said reference design into a reference gate netlist;

performing an equivalence check between said reference gate netlist and said netlist of said circuit design;

extracting an adder network from the reference design;

checking arithmetic functions the adder network can perform, wherein said reference design is corrected if said extracted adder network does not perform the correct arithmetic function;

when generating said reference gate netlist as a gate level reference, each call to a function of the partial product generator causing an instantiation of a corresponding generic VHDL entity;

generating an arithmetic bit level description of said reference design by expanding the Booth-encoded partial products into weighted sums of bitwise multiplications; and deciding on the correctness of said circuit design based on the results of the equivalence check between the reference gate netlist and the netlist of the circuit design and the arithmetic function check of the extracted adder network.

2. The method of claim 1, wherein the arithmetic-function correctness of said reference design is established by bit-level transformations matching said reference design against a standard multiplication specification.

3. The method of claim 1, wherein said circuit design is corrected if said reference gate netlist is not equivalent to said netlist of said circuit design.

4. A system for formal verification of an electronic circuit design, said electronic circuit performing at least one arithmetic multiplication operation, wherein a netlist of said circuit design is provided, and wherein said circuit design is based on a Booth encoding for the multiplication operations, said system comprising:
  a processor;
  a data bus coupled to said processor; and
  a computer-usable medium embodying computer code, said computer-usable medium being coupled to said data bus, said computer program code comprising instructions executable by said processor and configured for:
    providing a reference design on a word level which is based on an abstract language specification comprising an arithmetic and a structural description for a netlist of said reference design, wherein said specification further comprises a partial product generator that determines a chosen Booth-encoding and computes the partial product with respect to this encoding, and wherein said specification comprises an adder tree that sums all partial products, and wherein the adder networks of both the reference design and the circuit design have the same topology, and wherein the Booth encoding of said reference design is equal to the Booth encoding of said circuit design;
    adding correction signals for sign conversion of negative values to said reference design and said circuit design;
    converting said reference design into a reference gate netlist;
    performing an equivalence check between said reference gate netlist and said netlist of said circuit design;
    extracting an adder network from the reference design;
    checking arithmetic functions the adder network can perform, wherein said reference design is corrected if said extracted adder network does not perform the correct arithmetic function;
    when generating said reference gate netlist as a gate level reference, each call to a function of the partial product generator causing an instantiation of a corresponding generic VHDL entity;
    generating an arithmetic bit level description of said reference design by expanding the Booth-encoded partial products into weighted sums of bitwise multiplications; and
    deciding on the correctness of said circuit design based on the results of the equivalence check between the reference gate netlist and the netlist of the circuit design and the arithmetic function check of the extracted adder network.

5. The system of claim 4, wherein the arithmetic-function correctness of said reference design is established by bit-level transformations matching said reference design against a standard multiplication specification.

6. The system of claim 4, wherein said circuit design is corrected if said reference gate netlist is not equivalent to said netlist of said circuit design.

7. A non-transitory computer-usable medium embodying computer program code for formal verification of an electronic circuit design, said electronic circuit performing at least one arithmetic multiplication operation, wherein a netlist of said circuit design is provided, and wherein said circuit design is based on a Booth encoding for the multiplication operations, said computer program code comprising computer executable instructions configured for:
  providing a reference design on a word level which is based on an abstract language specification comprising an arithmetic and a structural description for a netlist of said reference design, wherein said specification further comprises a partial product generator that determines a chosen Booth-encoding and computes the partial product with respect to this encoding, and wherein said specification comprises an adder tree that sums all partial products, and wherein the adder networks of both the reference design and the circuit design have the same topology, and wherein the Booth encoding of said reference design is equal to the Booth encoding of said circuit design;
  adding correction signals for sign conversion of negative values to said reference design and said circuit design;
  converting said reference design into a reference gate netlist;
  performing an equivalence check between said reference gate netlist and said netlist of said circuit design;
  extracting an adder network from the reference design;
  checking arithmetic functions the adder network can perform, wherein said reference design is corrected if said extracted adder network does not perform the correct arithmetic function;
  when generating said reference gate netlist as a gate level reference, each call to a function of the partial product generator causing an instantiation of a corresponding generic VHDL entity;
  generating an arithmetic bit level description of said reference design by expanding the Booth-encoded partial products into weighted sums of bitwise multiplications; and
  deciding on the correctness of said circuit design based on the results of the equivalence check between the reference gate netlist and the netlist of the circuit design and the arithmetic function check of the extracted adder network.

8. The computer-usable medium of claim 7, wherein the arithmetic-function correctness of said reference design is established by bit-level transformations matching said reference design against a standard multiplication specification.

9. The computer-usable medium of claim 7, wherein said circuit design is corrected if said reference gate netlist is not equivalent to said netlist of said circuit design.

10. The computer-usable medium of claim 7, wherein:
  the arithmetic-function correctness of said reference design is established by bit-level transformations matching said reference design against a standard multiplication specification; and
  said circuit design is corrected if said reference gate netlist is not equivalent to said netlist of said circuit design.

* * * * *